United States Patent [19]

Parato

[11] 4,138,645
[45] Feb. 6, 1979

[54] WIDEBAND SIGNAL CALIBRATION SYSTEM

[75] Inventor: Vito J. Parato, Bay Shore, N.Y.

[73] Assignee: Cutler-Hammer, Inc., Milwaukee, Wis.

[21] Appl. No.: 802,173

[22] Filed: May 31, 1977

[51] Int. Cl.² ............................................ H04B 17/00
[52] U.S. Cl. ..................................... 325/363; 325/67;
325/398; 325/407; 343/17.7; 331/44
[58] Field of Search ...................... 325/363, 2, 18, 67,
325/407, 408, 398; 331/44; 343/17.7

[56] References Cited
U.S. PATENT DOCUMENTS 4,031,469  6/1977  Johnson ................................. 325/67

*Primary Examiner*—Robert L. Griffin
*Assistant Examiner*—Tommy P. Chin
*Attorney, Agent, or Firm*—Kevin Redmond

[57] ABSTRACT

A calibration system for a wideband superheterodyne receiver in which a fixed-frequency signal source supplies an IF signal to the mixer for conversion to an RF signal. The RF signal produced in this manner passes through the RF components of the receiver to the input port of the receiver where it is detected by a wideband detector. The video output signal from the detector provides an indication of the RF gain of the receiver required for calibration. The fixed frequency IF signal may be converted to an RF signal for calibration purposes at every frequency that the receiver can accommodate merely by sweeping the local oscillator throughout its frequency range.

11 Claims, 13 Drawing Figures

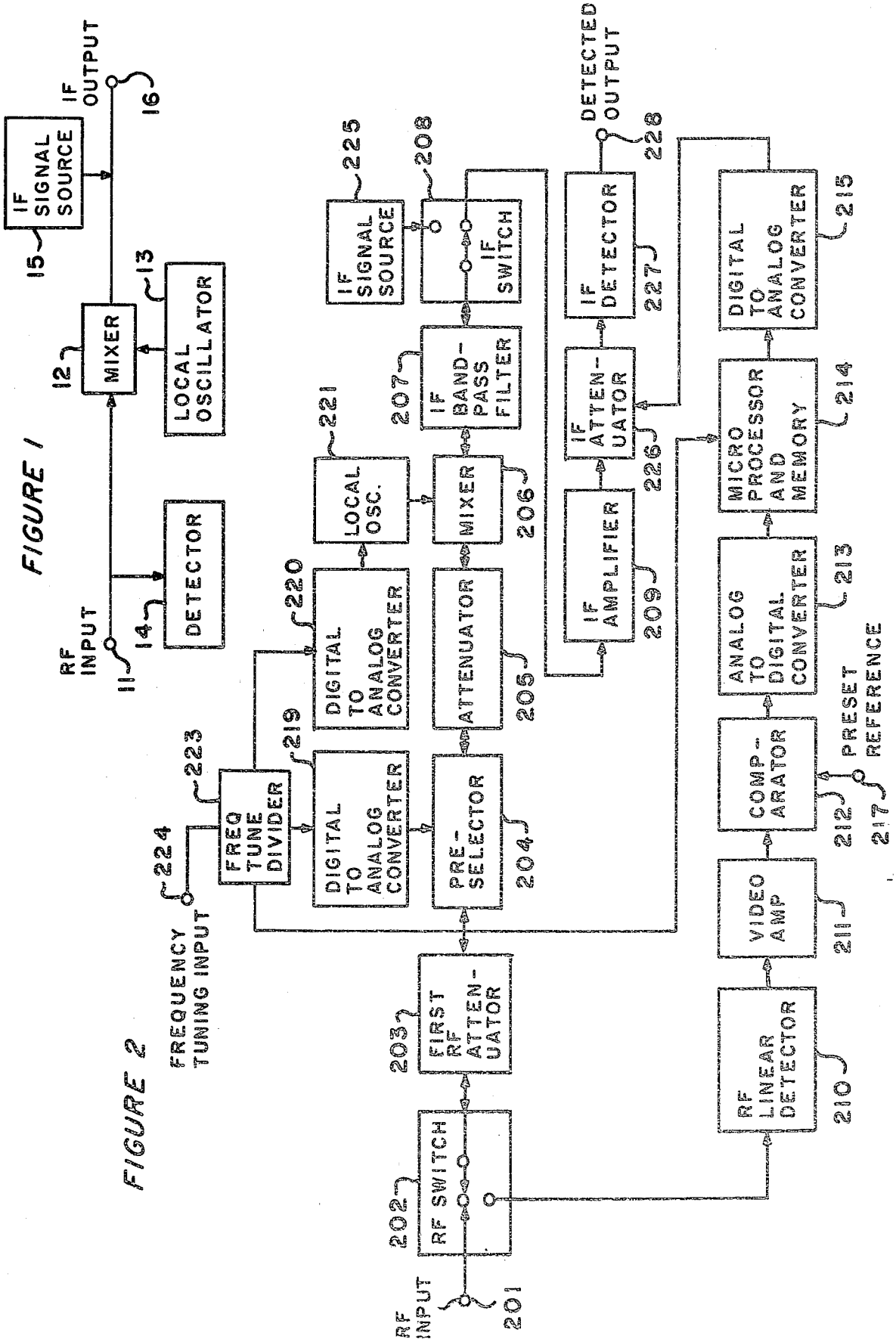

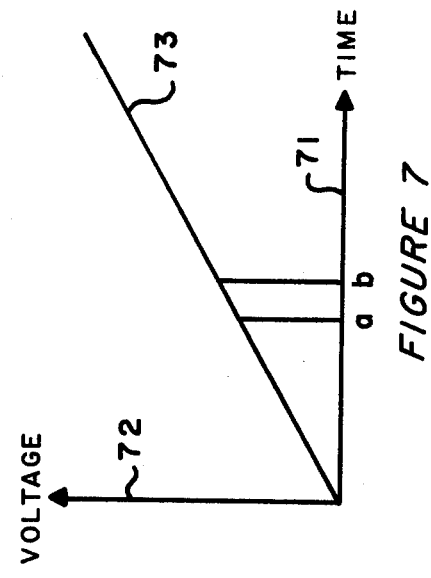
FIGURE 7
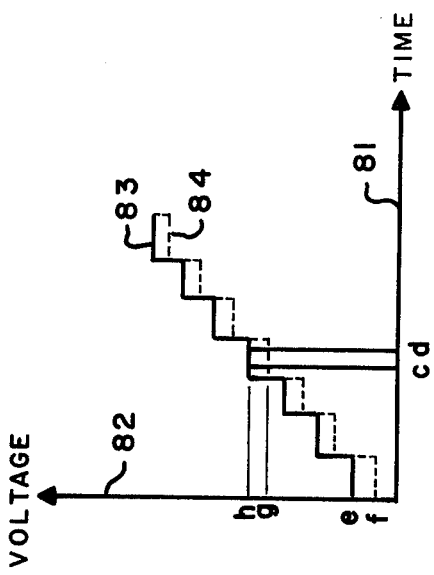
FIGURE 8A
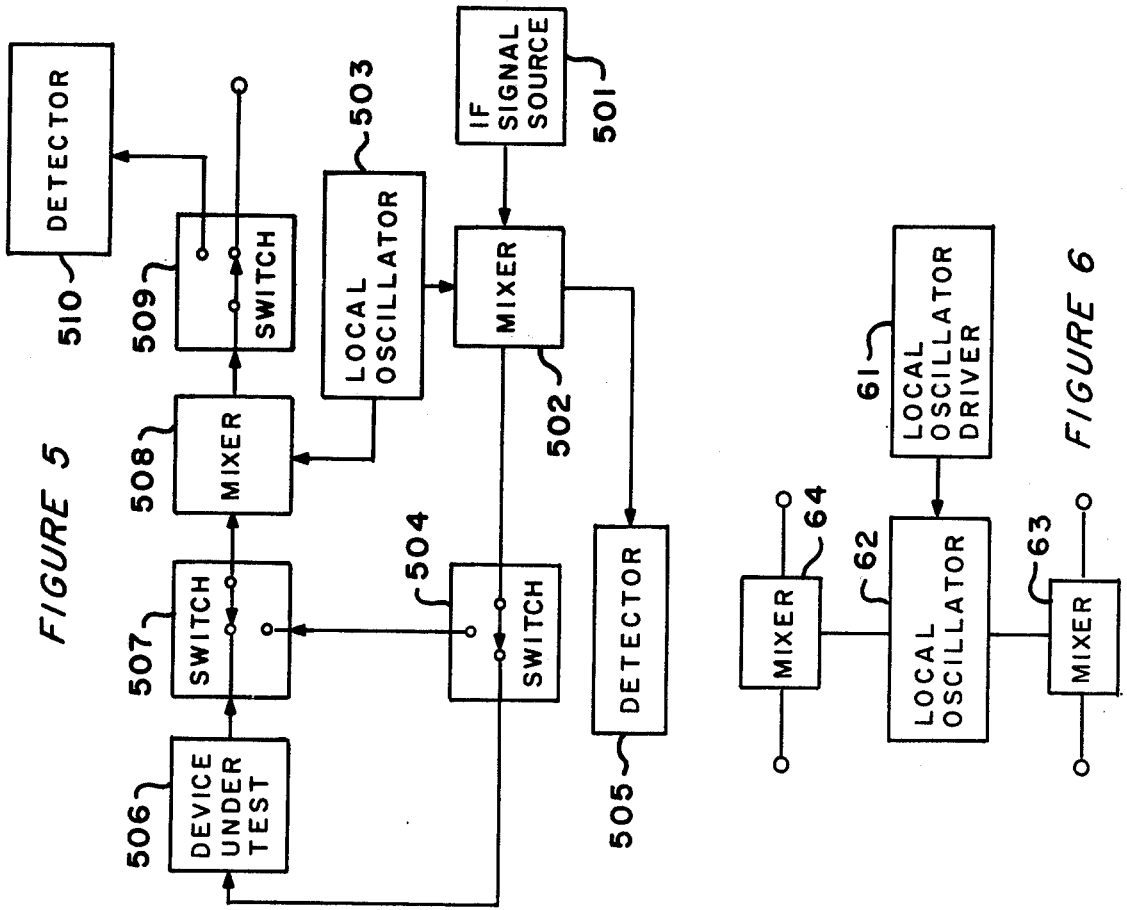

WIDEBAND SIGNAL CALIBRATION SYSTEM

BACKGROUND

1. Field

This invention pertains to the calibration of receiving systems and, in particular, to the calibration of wideband systems, such as panoramic radio receivers, scanning receivers and spectrum analyzers.

2. Prior Art

Frequency scanning superheterodyne receivers are well known. With the development of modern microwave devices, the frequency range of such receivers has been extended to frequencies well beyond 20 GHz. The ability of these receivers to continuously sweep over wide bandwidths has also been extended, as illustrated by the multioctave tuning range of the receiving system described in U.S. Pat. No. 3,701,949.

The increase in tuning range of such receivers has not been achieved without drawbacks. One of the major problems of wideband receivers is the variation in gain across the RF frequency range. These variations in gain are caused by changes in the transfer characteristics of the RF components and also by mistracking between the preselector and local oscillator. The typical variations in gain of such receivers over a band of 2 to 12 GHz can be as high as ±6 dB.

Conventional amplitude calibration procedures may be used to correct for these gain variations over limited frequency ranges; however, such procedures usually require, as a minimum, a signal generator and power meter capable of covering the narrow frequency range of interest.

In calibrating a receiver with this equipment, the power supplied by the signal generator to the receiver is monitored by the power meter and the output level of the receiver is compared to the readings of the power meter. Over relatively narrow frequency ranges the data provided by the power meter and output level indicator may be manually recorded and a correction chart made for correcting the data produced by the receiver.

Over wide frequency ranges, the cost and labor involved in carrying out manual calibration and correction procedures are prohibitive making an automatic system a practical necessity. A wideband automatic system is capable of eliminating the high labor cost associated with manual calibration systems, but a conventional automatic system inherently require a significant capital investment in a wideband signal generator and power meter as well as automatic recording equipment.

SUMMARY

It is an object of the present invention to eliminate the need for a wideband signal generator and power meter usually required in the calibration of a wideband receiving system.

According to this invention, an IF signal supplied to the IF port of the mixer in a superheterodyne receiver is converted to a signal at an RF frequency which is detected at the input port of the receiver by a wideband detector. Since the RF signal must pass through the RF components of the receiver to reach the input port, its level, as indicated by the detector output, is a measure of the gain of the front end. Gain, as used herein, is intended to include positive as well as negative gain or loss.

The flow of the RF signal through the RF components during calibration is the reverse of that during reception; however, the direction of flow is not important in most instances because the RF components are usually reciprocal; that is, they have the same gain in either direction. In cases where some components are nonreciprocal, provision may be made for reversing or bypassing these components during calibration.

In calibrating a receiver with the present invention, the IF calibration signal is held constant and the detector, either directly or in combination with a video amplifier, detects the RF signal at the receiver input port to provide a video output which varies as a function of the RF signal as it is swept over the RF tuning range of the receiver. The detector output is a direct indication of the receiver gain, and, as such, contains information from which receiver calibration data may be determined. This data may be used in a manual calibration system or applied to a system which automatically adjusts the receiver gain to compensate for gain variations. In an automatic system the frequency at which the data is taken is stored in a memory along with the calibration data. After all the calibration data has been stored, the receiver is switched to normal receiver operation, and the stored data is applied, by way of a microprocessor, to a voltage controlled attenuator which automatically adjusts the receiver gain in accordance with the stored calibration data to provide a constant receiver gain regardless of the operating frequency.

BRIEF DESCRIPTION OF THE DRAWINGS

FIG. 1 is a block diagram of a portion of a basic superheterodyne receiver incorporating an IF signal source for calibration purposes.

FIG. 2 is a block diagram of a complex superheterodyne receiver incorporating an IF signal source for calibration purposes.

FIG. 5 is a block diagram of a two channel superheterodyne receiver with a common local oscillator.

FIG. 6 is a block diagram of a portion of a two channel superheterodyne receiver with a common local oscillator and a local oscillator drive circuit.

FIG. 7 is a graph of a ramp voltage waveform for driving the local oscillator.

DESCRIPTION

Figure 3:
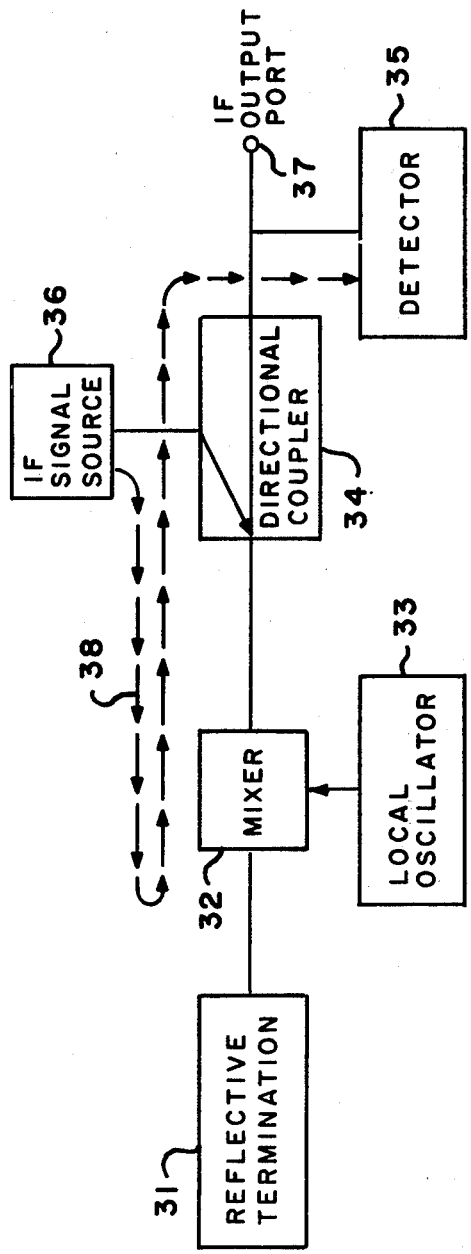
FIG. 3 is a block diagram of a superheterodyne receiver incorporating an IF signal source and a reflective termination at the RF port of the receiver for calibration purposes.

The superheterodyne receiver of FIG. 1 comprises a mixer 12, a local oscillator 13, a detector 14, a calibration signal source 15, an RF input port 11 and an IF output port 16.

This receiver is designed to operate in either a reception or calibration mode. In the reception mode, an RF signal supplied to the RF input port 11 is transmitted to the mixer 12 where it is converted to an IF signal which appears at the IF output port 16. As there is no preselection, the tuning of this basic superheterodyne receiver is accomplished by merely changing the frequency of the local oscillator. In a more practical system, a preselector and an IF filter are usually necessary to eliminate spurious radiation and image responses; however, these considerations are not taken into account in the simple receiver of FIG. 1 to permit the presentation of only those components necessary to describe the present invention.

In the calibration mode, a fixed frequency IF signal from source 15 is supplied to the IF port of mixer 12 where it is converted to a signal at an RF frequency. This RF signal is always at the frequency to which the receiver is tuned by virtue of the fact that the mixer is reciprocal in frequency. For example, when an RF signal at the frequency to which the receiver is tuned is applied to the mixer, it will produce a signal at the IF frequency of the receiver and when a signal at the IF frequency of the receiver is applied to the mixer, it will produce an RF signal at the frequency to which the receiver is tuned. The mixer reciprocal properties remain true for up or down conversion and therefore the present invention is applicable for receivers using either type of conversion.

The IF calibration signal from source 15 is maintained at a constant frequency and amplitude. A wideband detector 14 is connected to the RF port of the receiver to measure the RF level. The ratio of the IF input signal at port 16 to the RF level as indicated by the output of the detector 14 is a measure of the RF gain of this receiver.

The calibration system described with the aid of the basic receiver of FIG. 1 may be applied to a more complex receiver, such as the receiver shown in FIG. 2. This receiver includes the calibration system of FIG. 1 as well as a microprocessor and a digital memory for automatically correcting the gain of the receiver in accordance with stored calibration data.

The receiver of FIG. 2 comprises an RF switch 202, a first RF attenuator 203, a preselector 204, a second RF attenuator 205, a mixer 206, an IF band-pass filter 207, an IF switch 208, an IF amplifier 209, an IF attenuator 226, an IF detector 227, an RF input port 201, a detector output port 228, an IF calibration signal source 225, a local oscillator 221, an RF detector 210, a video amplifier 211, a preset reference input port 217, a comparator 212, an analog to digital converter 213, a microprocessor and digital memory 214, a frequency tuning input port 224, a frequency tuning signal divider 223, and digital to analog converters 215, 219, and 220.

This receiver is designed to operate in either a reception or calibration mode. The mode of operation is determined by the position of the RF and IF switches. With the switches in the position shown in FIG. 2, the receiver is set to operate in the reception mode. In this mode, an RF signal at port 201 is passed through the switch 202, the RF attenuator 203, the preselector 204, the attenuator 205 to the mixer 206 where it is converted to a signal at the IF frequency of the receiver. The IF signal is passed through the bandpass filter 207, the switch 208, the IF amplifier 209, the IF attenuator 226 to the IF detector 227. The detected output is supplied to port 228.

Frequency tuning information is fed to the frequency tuning divider 223 where it is divided three ways and supplied to the digital to analog converters 219 and 220 and to the memory 214. The digital to analog converter 219 produces an analog voltage to tune preselector 204, while converter 220 produces a voltage to tune the local oscillator 221.

In the calibration mode, the switches 202 and 208 are switched. The signal from the IF calibration source 225 is fed through the switch 208 and the band-pass filter 207 to the mixer 206 where it is converted to a signal at the RF frequency to which the receiver is tuned. The RF signal is passed through the attenuator 205, the preselector 204, the attenuator 203, the switch 202 to the detector 210 which produces a video signal that contains information indicating the gain of all the components through which the calibration signal has passed. The output of the detector is amplified in video amplifier 211 and then compared in the comparator 212 with a preset reference which corresponds to the level of the IF calibration signal to provide an output from the comparator 212 which represents a measure of the gain of the components through which the calibration signal has passed. The output of the comparator is passed through analog to digital converter 213 before it is stored in the memory 214.

The frequency tuning information is supplied directly to the memory 214 from divider 223 so that at the time the amplitude calibration data is stored in the memory, the frequency at which the receiver is tuned is also stored. In this way, each entry of the calibration data is identified by the corresponding frequency of the receiver at which the data was measured.

As the receiver is tuned across its RF band in the receiving mode, the calibration data, which is amplitude correction data, is retrieved from the microprocessor and memory 214 and supplied to the digital analog converter 215. The output of converter 215 controls the attenuator 226 which adjusts the receiver gain in accordance with the calibration data to provide a corrected receiver output at port 228.

The output of the converter 215 may be used to drive a gain adjusting device located in the RF, IF or video portions of the receiver. Where a log video amplifier is used to amplify the output of the detector, an algebraic addition circuit may be conveniently used in the video circuit to correct the gain as a logarithmic amplifier mathematically converts the gain adjustment function from multiplication to algebraic addition.

The microprocessor and memory unit 214 may be preprogrammed to compensate for nonlinearity or other errors in the detector and other calibration components over their respective frequency and dynamic ranges.

FIG. 3 illustrates a calibration system which embodies the principal of the invention illustrated in FIGS. 1 and 2, but eliminates the wideband detector shown in these figures. This can be a significant advantage as there can be difficulty in providing a wideband detector with a flat response over the entire RF band of the receiver. The system shown in FIG. 3 comprises reflective termination 31, a mixer 32, a local oscillator 33, an IF directional coupler 34, an IF calibration signal source 36, an IF detector 35 and an IF output port 37.

In calibrating this system, the IF calibration signal source supplies a first IF signal to the mixer for conversion to an RF signal. The RF signal produced in this manner is transmitted from the RF port of the mixer to the reflective termination 31 where it is reflected and returned to the mixer. The reflected signal is converted to a second IF signal which is detected by the IF detector 35. The flow of the signals from the IF source 36 to the detector 35 is shown by the arrows 38 above the drawing. As can be seen from these arrows, the calibration signal flows through the RF portion of the receiver twice, and therefore the level detected by detector 35 is an indication of twice the gain of the RF portion of the receiver.

The system of FIG. 3 offers a number of cost advantages. The IF detector 35 operates at a single frequency and therefore is lower in cost than the wideband detectors required for the systems shown in FIGS. 1 and 2. In most receivers there is usually an IF amplifier which can be used to amplify the second IF signal before detection, thereby reducing the sensitivity requirements of the IF detector and, in some cases, it may be possible to use the IF detector which is a standard part of the receiver for both calibration and reception.

There are a number of precautions which must be observed if useful results are to be obtained with the system of FIG. 3. All of the components must exhibit low VSWR and the directivity of the coupler must be high to keep the two IF signals separate. In addition, a constant, high VSWR is required for the reflective termination across the entire RF band of the receiver to provide sufficient reflected signal for detection. The VSWR and directivity requirements may restrict the usable frequency range over which this system may be used.

Figure 4:
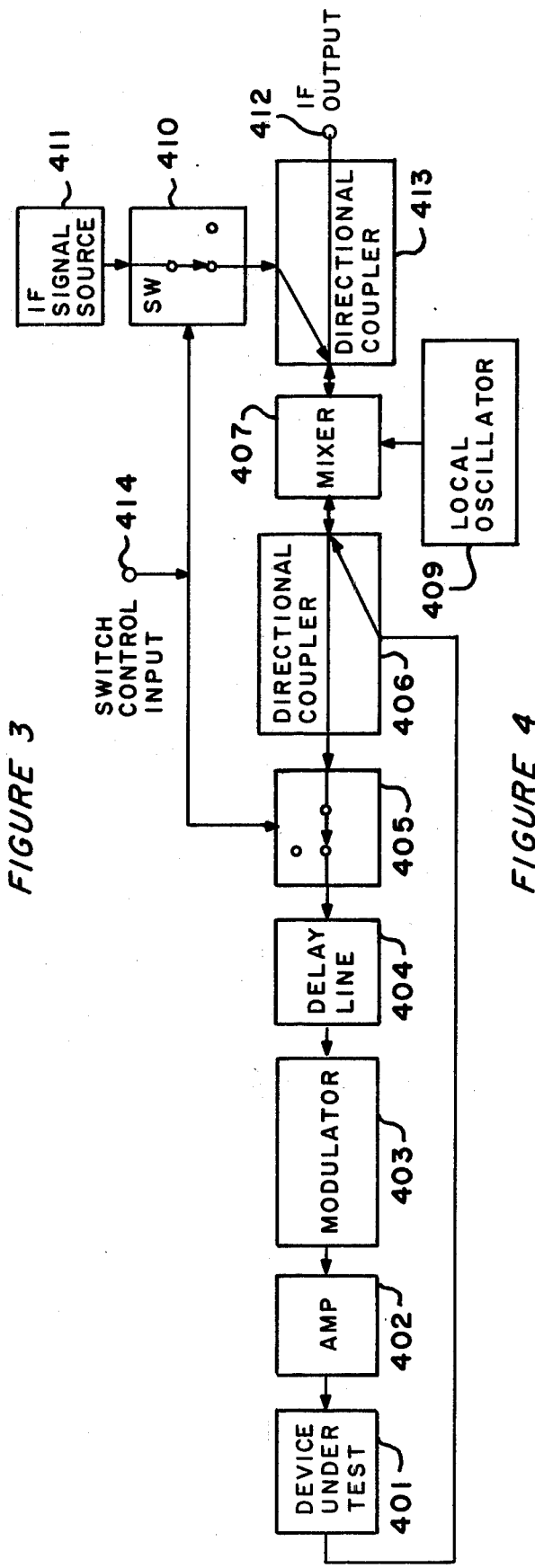
FIG. 4 is a block diagram of a superheterodyne receiver incorporating an IF signal source to generate a calibration and test signal at the RF port of the receiver.

The present invention may also be used to produce a test signal which is always at the RF frequency to which a receiver is tuned. The production of this type of test signal usually requires a separate instrument, generally referred to as a tracking oscillator. The system shown in FIG. 4 illustrates one method of producing the RF test signal without such an oscillator. This system also embodies a number of methods for differentiating the test signal before and after it has passed through the device under test. These methods aid in reducing the directivity requirements of the directional coupler in this circuit.

The system of FIG. 4 comprises an amplifier 402, a modulator 403, a delay line 404, a first switch 405, a first directional coupler 406, a mixer 407, a local oscillator 409, a second directional coupler 413, an IF signal source 411, a second switch 410, a switch control input port 414, an IF output port 412 and a device under test 401.

In operating this system for the purpose of measuring the gain of a device under test, an IF signal supplied by the source 411 is passed through the switch 410 and the auxiliary port of the directional coupler 413 to the mixer 407 to produce an RF signal at the RF port of the mixer. The RF signal is passed through the directional coupler 406, the switch 405, the delay line 404, the modulator 403, the amplifier 402 to the device under test 401. The signal is then returned from the device under test to the auxiliary port of the directional coupler 406 where it is directed back through the mixer 407, the directional coupler 413 and finally to output port 412.

The directional couplers 406 and 413 separate the signal transmitted by IF source 411, from the signal returned through the receiver after passing through the device under test. If the directional couplers and the components exhibit ideal directivity and VSWR, only the IF signal, produced from the RF test signal after it has passed through the device under test, is received at the output port 412. However, the directional couplers and components in practical systems will exhibit less than ideal directivity and VSWR and a portion of the signal transmitted from the IF signal source 411 will leak or be reflected to the output port 412 without ever having passed through the device under test. The effect of the leaked or reflected IF signal is to produce erroneous output levels.

The leaked IF signal may be separated from the desired IF signal by several methods. In the first of these methods, the signals are separated by means of the delay line 404 and the switches 405 and 410. The IF signal is pulse modulated by the switch 410. Switch 405 is driven in synchronism with switch 410 by a common control signal supplied at the port 414. The synchronism of these switches will pass the pulsed signal to the front end. The pulse is delayed in the line 404 before it appears at the device under test 401. The switches 405 and 410 are then shut off to terminate the pulse. The pulse produced in this manner is passed through the device under test and then is returned through the receiving system for detection. While the switches are in the off position, the pulse returning through directional coupler 406 is prevented from entering the device under test by switch 405 and from entering the IF signal source 411 by switch 410.

A second method of separating the IF signals employs tone modulation of the test signal which is produced by the modulator 403. The tone modulated signal is detected at the IF output. The transmitted and return signals are separated by the fact that only the tone modulated signal will have passed through the device under test.

An alternative approach to producing a tracking test signal is illustrated by the dual channel receiving system shown in FIG. 5. The system of FIG. 5 comprises a first mixer 502, a local oscillator 503, a first switch 504, a first detector 505, a device under test 506, a second switch 507, a second mixer 508, and a third switch 509, a second detector 510, an IF signal source 501 and an output port 511.

In this system, an IF signal supplied by the IF source 501, is converted in mixer 502 to an RF signal at the frequency to which the receiver channel, comprising the mixer 508 and the local oscillator 503 is tuned. This frequency is produced in mixer 502 by virtue of the fact that both the mixers 502 and 508 are supplied by the common local oscillator 503. The RF signal produced at the RF port of mixer 502 may be used to test a device under test such as 506 or may be used for calibration by bypassing the device under test and feeding the signal directly to mixer 508. The bypassing is accomplished by switches 504 and 507.

The signal level produced by mixer 502 is monitored by the detector 505 which is connected to the RF output port of this mixer. The IF output of the receiver is measured by detector 510 which is connected to the output by means of switch 511. The difference in amplitude levels at the detectors supplies the information required to determine the receiver gain.

A swept receiver generally incorporates a local oscillator drive circuit, such as shown in FIG. 6. The system of FIG. 6 is a dual channel receiver which comprises a first mixer 63, a common local oscillator 62, a second mixer 64 and an LO drive 61 that supplies a sweep control voltage to the local oscillator 62 which is usually a sawtooth waveform such as that shown in FIG. 7. In FIG. 7, the ordinate 72 represents the voltage axis, the abscissa 71 represents the time axis, and the waveform 73 represents the ramp portion of a sawtooth waveform.

The systems employed to calibrate a receiver may be divided into two general classes. In the first class, the system relies on stored data, such as the system shown in FIG. 2. In the second, there is no reliance on stored data. Instead the receiver is either time shared to perform the calibration and measurement functions or these functions are carried out simultaneously. In stored data systems, the number of calibration points is limited by the capacity of the memory unit, whereas the continuous class is theoretically unlimited in this respect. However, the time shared class does require a longer measurement period than the stored data system because it successively measures and calibrates. Despite the longer measurement period, the time shared class does provide two important advantages. All points may be calibrated and no memory unit is required.

The time shared class may be divided into two subclasses. In the first of these, the receiver is calibrated at one frequency and a short time later, before the frequency has changed appreciably, a receiver measurement is made. The calibration and measurement points are nearly at the same frequency so that there is little chance the calibration data has changed appreciably. For example, in FIG. 7 at time "a", the receiver may be calibrated and at time "b" a measurement may be made.

In the second subclass no calibration error occurs except for drift. The reason for this is illustrated by the oscillator drive voltage shown in FIG. 8A. In this Figure, the voltage is represented by the ordinate 82 and time is represented by the abscissa 81. A staircase waveform 83 represents the sweep drive voltage. Waveform 84 shown in dashed lines represents a second staircase waveform. Two instants in time at the same frequency are represented by letters c and d.

In the operation of a system with this type of oscillator drive voltage, the receiver is calibrated at time c and a receiver measurement is taken at time d. During the time period from time c to time d, the oscillator control voltage remains constant and thereby maintains the local oscillator at the same frequency except for any tuning drift which might occur over this short interval.

The number of calibration points can be easily increased in a system using the type of staircase sweep drive voltage shown in FIG. 8A by varying the starting voltage of the staircase waveform on successive sweeps. Consider, for example, waveforms 83 and 84 in FIG. 8A. These waveforms are identical except for their starting voltages, which are represented by the letters e and f. If the sweep drive voltage 83 is first applied to the oscillator, calibration at time c will occur when the oscillator is at a frequency corresponding to the control voltage h, whereas when drive voltage 84 is applied, the oscillator frequency at time c will correspond to the voltage g. A different set of calibration and measurement points may be covered on successive sweeps by simply placing the staircase on a dc pedestal and shifting the pedestal to shift the starting voltage of staircase waveform. If this is done in a number of equal increments, the frequencies at which accurate measurements can be made is multiplied by the number of increments required to equal a single step.

A random or jittered increment in the dc starting voltage may also be used. If the value of the increment is completely random, over a period of time, virtually all frequencies will be calibrated. Although the time for producing virtually all frequencies may be quite long in a practical measurement operation, a jittered system has an advantage in that there is a chance that any selected frequency will eventually be produced, whereas a sweep drive voltage which is controlled by a uniform staircase waveform is guaranteed to never produce certain frequencies. This may be a serious drawback as important information may be present at the frequencies that are missed.

Figure 8B:
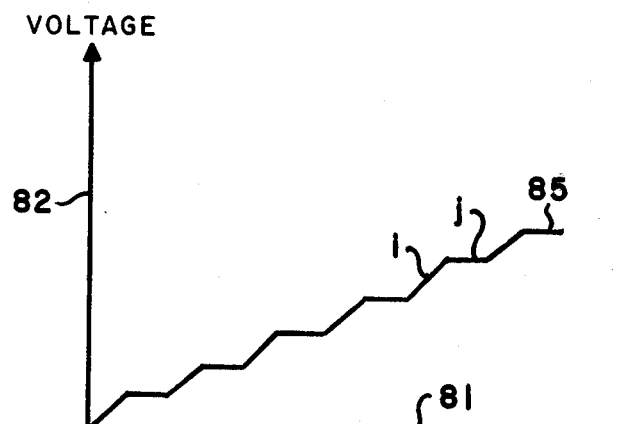
FIG. 8 is a graph of various voltage waveform for driving the local oscillator.

The staircase waveform may be modified as shown in FIG. 8B to produce all frequencies. In this Figure, the waveform 85 is formed of a series of waveform sub-sets comprising a ramp and a flat such as i and j. On the flat, calibration and measurement may be made, while during the period of the ramp, an output is provided without calibration. In a spectrum analyzer the output would be displayed over the complete frequency range and calibration would occur at points corresponding to the flats.

Figure 8C:
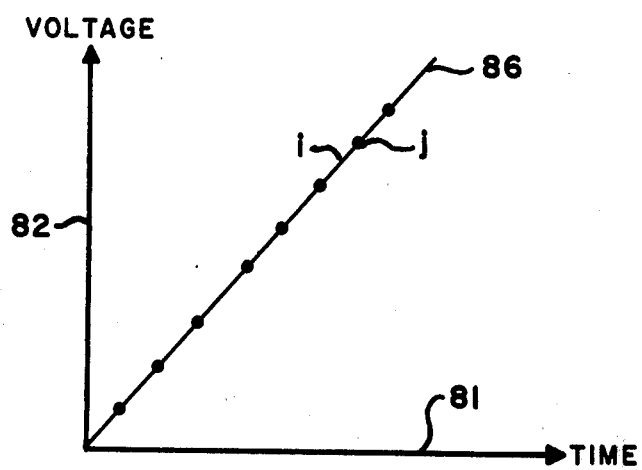

FIG. 8C shows a waveform 86 which appears to be a simple ramp with a number of calibration points indicated along the ramp, however, it is actually a waveform similar to waveform 85 in FIG. 8B with the periods of the flats shortened to be insignificant in comparison to the period of the ramp. Viewed in another way, the oscillator sweep is a ramp interrupted momentarily at a number of points for calibration. In a practical application, such as in a spectrum analyzer, this waveform would sweep the local oscillator and preselector across the operating frequency band in virtually a linear manner with short interruptions in the sweep for calibration and gain adjustment.

Figure 9:
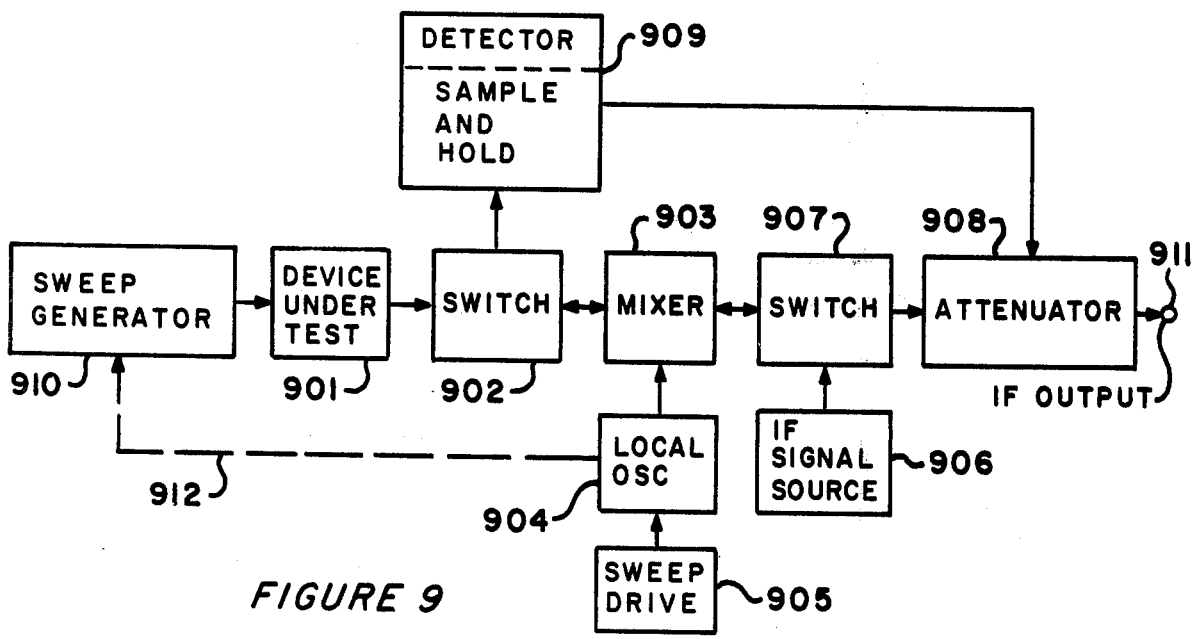
FIG. 9 is a block diagram of a time shared, self-calibrating receiving system.

A system for applying any of the wavefroms of FIG. 8 is shown in FIG. 9. This system comprises a switch 902, a mixer 903, a second switch 907, an attenuator 908, a detector and sample-and-hold-circuit 909, a local oscillator 904, a sweep drive circuit 905, an IF signal source 906, a sweep generator 910, a device under test 901, and an IF output port 911.

In the reception mode of operation of this system, a swept signal from the sweep generator 910 is passed through the device under test 901 and switch 902 to the mixer 903 which converts the RF signal to an IF signal. The IF signal is passed through the switch 907 and the attenuator 908 to the IF output port 911. The sweep generator 910 is designed to track the local oscillator frequency to maintain the generator signal at the frequency to which the receiver is tuned. This is accomplished by way of a connection between the local oscillator and the sweep generator indicated by line 912.

In the calibration mode, a signal from IF generator 906 is passed through the switch 907, to the mixer 903 where it is converted to an RF signal. The RF signal is passed through the switch 902 to the detector 909. The output of detector 909 is fed back to attenuator 908 to automatically adjust the level of the attenuation for a corrected output as described previously in the discussion concerning the system of FIG. 2.

The sweep drive generator 905 produces a staircase waveform such as that shown in FIG. 8A. The switches 902 and 907 are switched to permit calibration at a time c. The attenuator is properly set by the calibration system for the frequency to which the receiver is tuned. At a time d, while the frequency of the receiver remains the same, the switches are returned to their former positions placing the receiver in the reception mode. A correct measurement can then be made. The output of the receiver is automatically corrected by the calibration correction signals transmitted to the attenuator 908 from the detector 909. The correction signal is stored for the short period from time c to time d. The storage device for this short time span may be a sample-and-hold circuit shown housed with detector 909 in FIG. 9. A large digital storage unit such as the memory 214 in FIG. 2 is not required.

Figure 10:
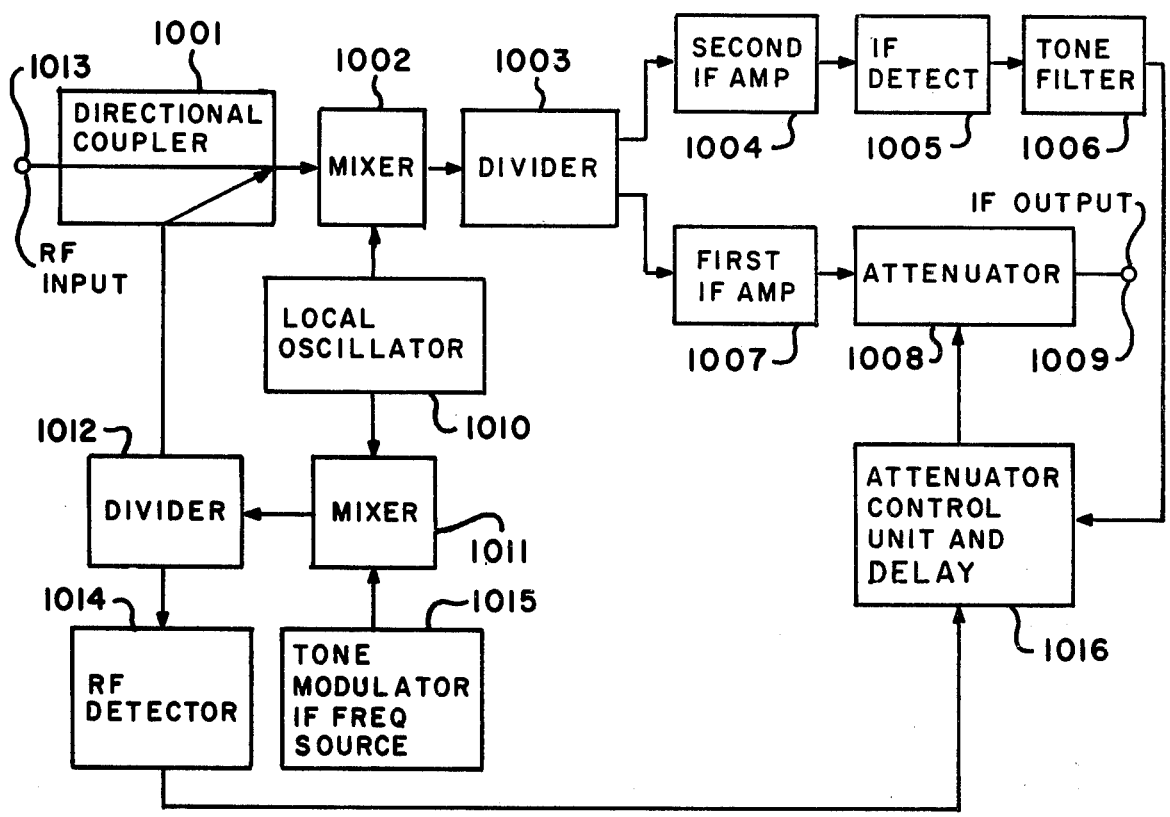
FIG. 10 is a block diagram of a continuous, self-calibrating receiving system.

Calibration and measurement may also be carried out simultaneously to remove the limitations on the number of calibration points and delays in measurement occurring in time sharing system. A system illustrating the way in which this may be accomplished is shown in FIG. 10.

This system comprises a directional coupler 1001, a mixer 1002, a first divider 1003, a first IF amplifier 1007, an attenuator 1008, a second IF amplifier 1004, an IF detector 1005, a tone filter 1002, a local oscillator 1010, a mixer 1011, a tone modulated IF source 1015, a second divider 1012, an RF detector 1014, an attenuator control and delay circuit 1016, an RF input port 1013 and an IF output port 1009.

When this system is operated in the reception mode, an RF signal applied to the input port 1013 is passed through the directional coupler 1001 to the mixer 1002 where it is converted to a signal at the first IF frequency. This signal is passed through the divider 1003, the first IF amplifier and the attenuator 1008 to the IF output port 1009.

Calibration is carried out by generating an RF signal from the IF signal source 1015. This source produces an IF signal that is at the center frequency of the second IF amplifier. The passbands of the first and second IF amplifier are sufficiently separated so that a signal at the center frequency of one will be rejected by the other. The IF signal from the signal source is supplied to the mixer 1011 where it is converted to a signal at an RF frequency. This signal is passed through the divider 1012, the auxiliary port of the directional coupler 1001 to the mixer 1002 where it is converted to the same IF frequency as the IF source by virtue of the fact that both mixers receive a signal from a common local oscillator. This IF signal is passed through the divider 1003, and the second IF amplifier 1004 to the IF detector 1005. The output of the IF detector is passed through the tone filter 1002 to the attenuator control circuit 1016. A portion of the RF signal from the mixer 1011 is supplied to the RF detector 1014 by way of the divider 1012. The output of the RF detector is also supplied to the attenuator control circuit. The output of the attenuator control circuit controls attenuator 1008 after a delay to account for the difference in time between calibration and measurement at a particular frequency.

The RF signal produced in mixer 1. 11 passes through all of the RF components of the rec iver. Its level before and after passing through these components is detected by the RF detector and the IF detector respectively. The ratio of the outputs of these detectors indicate the gain of the RF components of the receiver. The gain information is determined in the attenuator control circuit to produce a control signal for attenuator 1008. The output at port 1009 is thereby adjusted in accordance with the gain variations determined by the detector outputs.

The IF signal produced in the source 1015 may be tone modulated and the tone may be filtered after detection in filter 1002 to aid in separating the first and second IF signals. This technique can also be applied to eliminate one of the IF amplifiers by using a single IF frequency.

In the operation of the system shown in FIG. 10, a sweeping tracking oscillator linked to the local oscillator may be used to provide a swept input signal. Such sweeps are usually from a low frequency to a high frequency with the output being blanked on retrace. With this arrangement, the second IF frequency may be set to be at a higher frequency than the first IF so that the calibration signal frequency leads the test signal. In this way, there is a time lag in which to take the calibration measurement and adjust the attenuator 1008 to set it at the proper value for the test signal at the time the test signal is received.

A self-calibrating receiving system such as shown in FIG. 2 may be absolutely calibrated over its entire frequency range by correcting the internal IF calibration system at one frequency with a standard. Absolute calibration, as used herein, refers to calibration with a standard such as a signal source with a known output. When absolute calibration has been completed, the output of a receiver such as the display of a spectrum analyzer may be read in terms of absolute values such as decibels above or below zero dbm. The difference in the gain between that measured with an absolute standard and that measured with an internal IF calibration system constitutes a correction factor for the internal calibration system. The internal IF calibration system shown in FIG. 2 can be adjusted with this correction factor for all RF frequencies.

Figure 11:
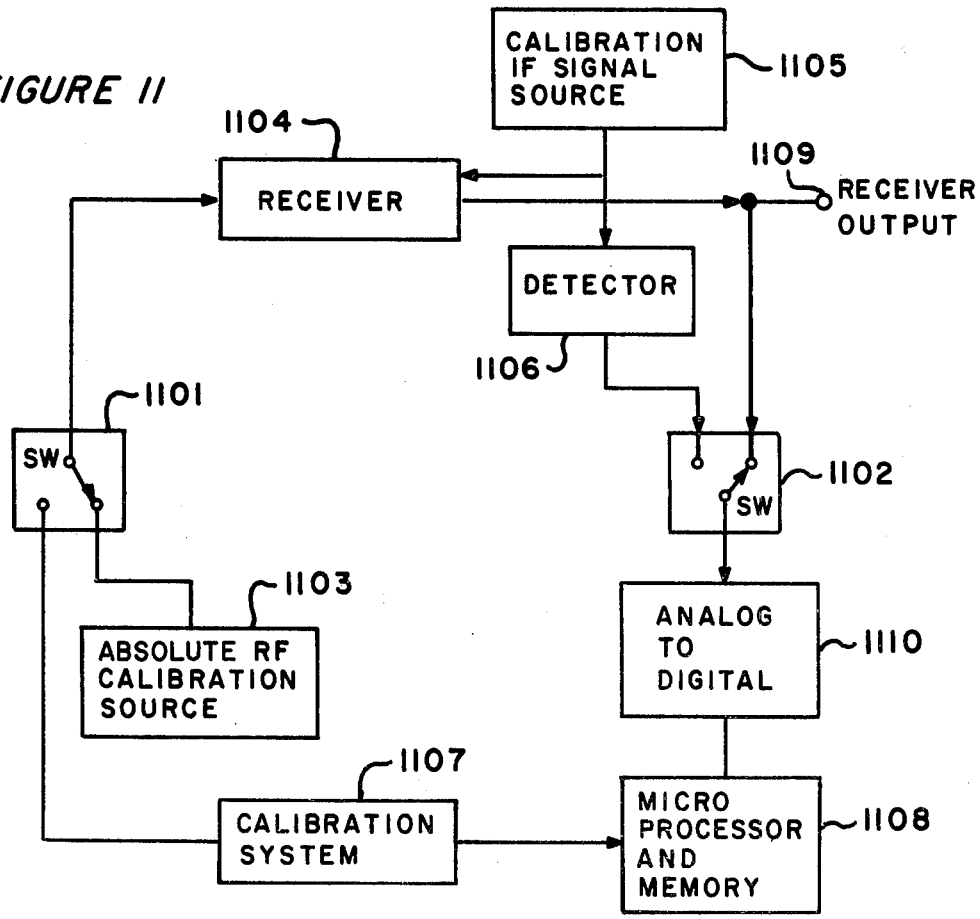
FIG. 11 is a block diagram of an absolute, self-calibrating receiving system.

FIG. 11 illustrates a system designed to provide absolute calibration of a receiver over its entire frequency range with the aid of a single frequency, absolute signal source. Such a source provides a known power output at one frequency. The system of FIG. 11 comprises a first switch 1101, a second switch 1102, a single frequency absolute source 1103, a receiver 1104, an IF source 1105, a detector 1106, a calibration system 1107, a microprocessor and memory unit 1108, a receiver output port 1109, and an analog to digital converter 1110.

The receiver 1104 shown in FIG. 11 comprises essentially all of the components in the receiver shown in the upper portion of FIG. 2 with the exception of a calibrated IF signal source, which is shown separately in FIG. 11, as source 1105. Similarly, the calibration system 1107 shown in FIG. 11 comprises essentially all of the components in the calibration circuitry shown in the lower portion of FIG. 2 with the exception of a microprocessor which is shown separately in FIG. 11 as microprocessor 1108.

In the absolute calibration of the receiver of FIG. 11, a representation of the power output provided by the absolute source is entered into the memory 1108 and switches 1101 and 1102 are set to the positions to the right, as shown. The absolute source 1103 is connected to the input of the receiver 1104 by way of the switch 1101, while the output of the receiver is fed through the switch 1102 to the analog to digital converter 1110 where this signal is converted to digital form and supplied to the microprocessor 1108. The receiver output signal is compared with the representations of the power delivered by the absolute source 1103 in the microprocessor 1108 to determine the absolute gain of the receiver. The absolute gain is then compared with the gain determined by the internal IF gain calibration system at the RF frequency of the absolute source 1103 to produce a correction factor which is then applied to the gain determined by the internal calibration system at all RF frequencies of the receiver.

Absolute gain calibration may also be carried out with an absolute source at IF. This merely requires substituting an absolute IF source for the calibration source 1105. The absolute RF source, such as 1103, can be eliminated in a system employing this type of IF source.

As an IF source such as 1105 is generally an internal source that may be subject to drift with age, the output level over a period of time may be monitored and corrected with the aid of a separate detector, such as the detector 1106, and a correction program contained in the microprocessor 1108.

In the calibrating system of FIG. 11 with the internal IF oscillator, the switches 1101 and 1102 are set to the positions to the left. The output from the detector 1106 is supplied to the microprocessor 1108 through the switch 1102 and the analog to digital converter 1110. This signal is compared with the RF signal produced within the receiver by the IF source after it has passed through the RF portion of the receiver 1104. This RF signal is supplied to the microprocessor through the switch 1101 and the calibration system 1107. The comparison produces a constant correction at all RF frequencies to which the receiver is tuned.

The absolute IF calibration system may be simplified by making the comparison in the microprocessor with a representation of the known output power of the absolute IF calibration source that has been entered and stored in the microprocessor, in a manner similar to that carried out for the absolute RF source 1103. This simplified system eliminates the need for the monitoring components such as the detector 1106, the switch 1102, and the analog to digital converter 1108.

Although the calibration method illustrated here apply to gain, it is obvious that phase or other parameter may be measured in a similar manner with the principal change being merely the substitution of a phase detector or other appropriate detectors for the amplitude detector shown.

I claim:

1. Apparatus for calibrating a superheterodyne receiver comprising:
   (a) means for applying a first IF signal to the mixer of the receiver,
   (b) means for extracting from the receiver an RF signal produced from said IF signal by the mixer, after said RF signal has passed through the RF components of said receiver,
   (c) means for comparing said first IF signal with said extracted RF signal to determine the ratio of the two and thus provide an indication of the RF gain of the receiver,
   (d) means for producing a representation of said RF gain and a representation of the calibration frequency at which said RF gain is measured,
   (e) means for storing said representation,
   (f) means for retrieving a stored gain representation by supplying to said means for storing, a representation of the calibration frequency at which said gain was measured, and
   (g) means for adjusting the gain of the receiver adapted to receive said retrieved representation of gain and adjust the gain of the receiver in accordance with said retrieved gain representation to provide uniform receiver gain at all said calibration frequencies.

2. Apparatus as claimed in claim 1, further comprising:
   (a) means for periodically interrupting said first IF signal supplied to the mixer,
   (b) means for maintaining said adjustment of the gain of the receiver during said periods of interruption, and
   (c) means for setting said receiver to a reception mode to receive input signal and function as a receiver during the periods of interruption of the said first IF signal.

3. Apparatus as claimed in claim 2, further comprising means for continually sweeping the tuning elements of the receiver in frequency throughout said periods of interruption and noninterruption of the IF signal.

4. Apparatus as claimed in claim 2, further comprising means for maintaining at one frequency the tuning elements of said receiver during the period of a cycle comprising one interruption and one noninterruption of the IF signal to calibrate the receiver at each cycle during the noninterruption and make a receiver measurement during the interruption after each calibration while the receiver remains at the calibration frequency and changing the frequency of the tuning elements at the end of each cycle incrementally to effectively sweep the receiver across its frequency range in a number of incremental steps.

5. Apparatus as claimed in claim 4, further comprising means for shifting the frequency of the tuning elements of the receiver at which each corresponding cycle is initiated on successive sweeps.

6. Apparatus as claimed in claim 1, further comprising reflective means connected to the RF input port of the receiver to reflect said extracted RF signal to the mixer where it produces a second IF signal.

7. Apparatus as claimed in claim 6, further comprising:
   (a) a first directional coupler with a through line port connected to the mixer,
   (b) means for connecting the first IF signal to an auxiliary port of the directional coupler to direct the first IF signal to the mixer and prevent the addition of the first IF signal to the second IF signal in the receiver output, and
   (c) means for comparing the level of the first IF signal and the second IF signal to provide an indication of the RF gain of said receiver.

8. Apparatus for calibrating a superheterodyne receiver comprising:
   (a) means for applying a first IF signal to the mixer of the receiver,
   (b) means for extracting from the receiver an RF signal produced from said IF signal by the mixer, after said RF signal has passed through the RF components of said receiver,
   (c) means for comparing said first IF signal with said extracted RF signal to determine the ratio of the two and thus provide an indication of the RF gain of the receiver,
   (d) a directional coupler having a through line with one port of said through line connected to the RF input port of the receiver, said coupler also having an auxiliary port through which a diverted portion of a signal on the through line is supplied,
   (e) a modulator connected to the remaining through line port of the directional coupler to modulate the RF signal produced by supplying the first IF signal applied to the mixer,
   (f) means for coupling the modulated RF signal from the modulator to the auxiliary port of the directional coupler to return the modulated RF signal to the mixer, and (g) modulation detection means in the IF circuit of the receiver to detect the second IF signal, whereby the first IF signal may be separated from the second IF signal by means of the modulation carried only on the second IF signal.

9. Apparatus for generating a calibration signal at the RF frequency of a superheterodyne receiver of the type including a mixer, a local oscillator and an IF section, said IF section having a passband characteristic centered about a center IF frequency and wherein an IF signal is produced when an RF signal is applied to the mixer by mixing said RF signal with a signal from the local oscillator, comprising:

(a) an auxiliary mixer connected to receive a portion of the local oscillator signal supplied to the receiver mixer, (b) an IF signal source supplying an IF signal to the auxiliary mixer at the same frequency as the center IF frequency of the receiver to produce an RF calibration signal at the frequency to which the receiver is tuned, (c) means for applying said RF calibration signal produced by said auxiliary mixer to the RF input port of the receiver, and (d) means for comparing said RF calibration signal applied to the RF input port of the receiver and the IF signal produced from said RF calibration signal in the receiver mixer to determine the ratio of the two and thus determine the RF gain of said receiver.

10. Apparatus as claimed in claim 9, further comprising:

(a) means for modulating said RF calibration signal, and (b) means for detecting the modulation on the IF signal produced by said RF signal to separate it from an IF signal produced by a second RF signal, whereby a gain measurement may be made for gain correction while said receiver is operating in a reception mode.

11. Apparatus for calibrating a superheterodyne receiver, comprising:

(a) an auxiliary mixer connected to receive a portion of the local oscillator signal supplied to the receiver mixer, (b) an IF signal source connected to supply an IF signal to the auxiliary mixer at a frequency that differs from the IF frequency of the receiver, to produce a first RF signal within the RF passband of the receiver, (c) means for coupling said first RF signal to the input port of the receiver, said coupling means having a port to accept a second RF signal at the frequency to which the receiver is tuned and supply said second RF signal to the RF input port of the receiver, (d) means for comparing said first RF signal and its corresponding IF signal produced in the mixer of the receiver to determine the RF signal of the receiver, and (e) gain adjustment means responsive to the RF gain as determined by said comparison to adjust the gain of the receiver and thereby provide a constant gain over the entire frequency range of the receiver while said receiver simultaneously processes said second RF signal.

* * * * *